United States Patent
Navon et al.

(10) Patent No.: US 11,029,872 B2
(45) Date of Patent: Jun. 8, 2021

(54) NON-VOLATILE STORAGE SYSTEM WITH DATA SHAPING MEMORY PARTITIONS

(71) Applicant: WESTERN DIGITAL TECHNOLOGIES, INC., San Jose, CA (US)

(72) Inventors: Ariel Navon, Revava (IL); Eran Sharon, Rishon Lezion (IL); Idan Alrod, Herzliya (IL); Alex Bazarsky, Holon (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/452,203

(22) Filed: Jun. 25, 2019

(65) Prior Publication Data

US 2020/0192591 A1    Jun. 18, 2020

Related U.S. Application Data

(60) Provisional application No. 62/781,101, filed on Dec. 18, 2018.

(51) Int. Cl.
*G06F 3/06* (2006.01)
*G11C 11/56* (2006.01)

(52) U.S. Cl.
CPC .......... *G06F 3/0644* (2013.01); *G06F 3/0614* (2013.01); *G06F 3/0673* (2013.01); *G11C 11/5628* (2013.01)

(58) Field of Classification Search
CPC .... G06F 3/0644; G06F 3/0614; G06F 3/0673; G11C 11/5628
See application file for complete search history.

(56) References Cited

U.S. PATENT DOCUMENTS

| | | |
|---|---|---|
| 5,838,832 A | 11/1998 | Barnsley |
| 7,266,026 B2 | 9/2007 | Gongwer et al. |
| 7,466,575 B2 | 12/2008 | Shalvi et al. |
| 8,341,501 B2 | 12/2012 | Franceschini et al. |
| 8,756,365 B2 | 6/2014 | Sharon |
| 9,355,721 B2 | 5/2016 | Yoon et al. |
| 9,575,683 B2 | 2/2017 | Achtenberg et al. |
| 2010/0042790 A1* | 2/2010 | Mondal ................. G06F 3/0641 711/161 |
| 2012/0311262 A1* | 12/2012 | Franceschini ....... G06F 12/0891 711/118 |
| 2013/0103891 A1 | 4/2013 | Sharon et al. |
| 2014/0281361 A1* | 9/2014 | Park ........................ G06F 3/061 711/206 |

FOREIGN PATENT DOCUMENTS

EP    2396791 B1    8/2014

\* cited by examiner

*Primary Examiner* — Larry T Mackall
(74) *Attorney, Agent, or Firm* — Vierra Magen Marcus LLP

(57) ABSTRACT

A non-volatile storage apparatus comprises a non-volatile storage and a control circuit connected to the non-volatile storage. The non-volatile storage structure is organized into multiple partitions. Each partition is preassigned to a different data shaping level. Data to be stored in the non-volatile storage is shaped based on its entropy. The control circuit is configured to write shaped data to a partition of the multiple partitions that is preassigned to a same shaping level as the shaped data.

16 Claims, 14 Drawing Sheets

Figure 8

Data type 1:
90% 0's, 10% 1's

```
0 0 0 0 0 1 0 0 0 0
0 1 0 0 0 1 0 0 0 0
0 0 0 0 0 0 0 0 0 0
0 0 0 0 0 0 0 0 0 1
0 0 0 1 0 0 0 0 0 1
         ⋮
1 0 0 0 0 0 0 0 0 0
```
↑
420

Data type 2:
50% 0's, 50% 1's

```
1 0 1 0 0 1 1 0 0 0
1 1 0 1 0 1 0 0 0 1
0 0 1 1 0 1 0 1 1 1
0 0 1 0 1 1 0 0 0 1
1 1 0 1 0 1 0 0 1 1
         ⋮
1 0 1 1 0 0 0 0 1 1
```
↑
422

NON-VOLATILE STORAGE SYSTEM WITH DATA SHAPING MEMORY PARTITIONS

This application claims priority to Provisional Application 62/781,101, filed on Dec. 18, 2018, titled "NON-VOLATILE STORAGE SYSTEM WITH DATA SHAPING MEMORY PARTITIONS," which application is incorporated herein by reference in its entirety.

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

Users of a memory system can program data into the memory system and read that data back out. In addition to reliably storing data, performance of the memory system is important to a user. For example, an entity attempting to store data in a memory system does not want to wait a long time for the programming of the data into the memory system to complete and does not want to use more power than necessary.

BRIEF DESCRIPTION OF THE DRAWINGS

Like-numbered elements refer to common components in the different figures.

FIG. 8 depicts two example sets of data.

DETAILED DESCRIPTION

Certain memory technologies exhibit asymmetrical performance when programming to different data states. For example, programming to one data state may be faster than programming to another data state. It is proposed to make use of this asymmetrical performance in order to increase programming throughput by allocating partitions in the memory and implementing a data shaping scheme that uses different partitions in the memory for different levels of data shaping.

One embodiment of a non-volatile storage apparatus that makes use of the proposed technology comprises a non-volatile storage structure and a control circuit connected to the non-volatile storage structure. The non-volatile storage structure is organized into multiple physical partitions. Each physical partition is preassigned to a different data shaping level. Data to be stored in the non-volatile storage is shaped based on its entropy. The control circuit is configured to write shaped data to a physical partition of the multiple physical partitions that is preassigned to a same shaping level as the shaped data.

Figure 1:
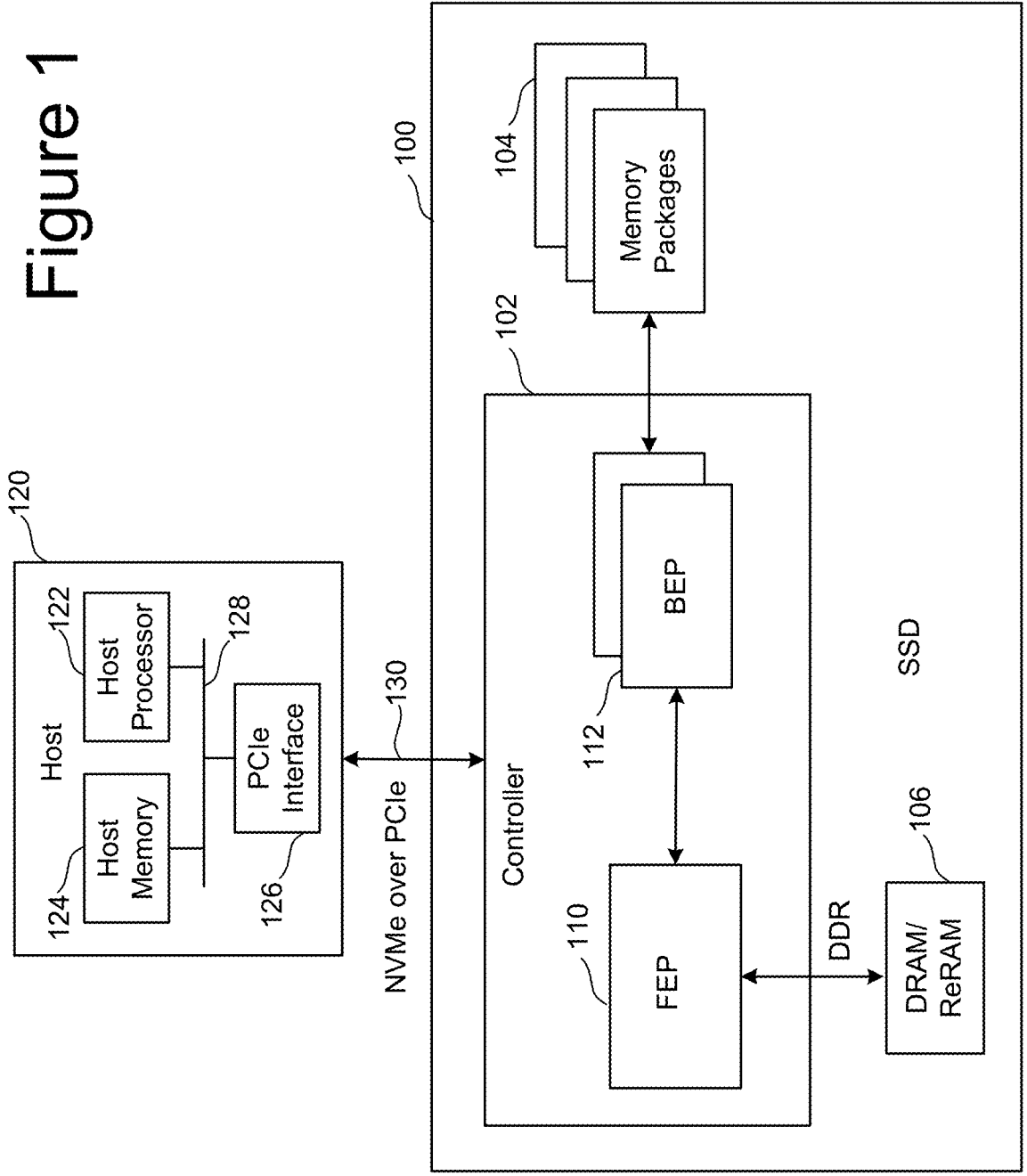
FIG. 1 is a block diagram of one embodiment of a memory system connected to a host.

FIG. 1 is a block diagram of one embodiment of a memory system 100 connected to a host 120. Memory system 100 can implement the technology proposed herein. Many different types of memory systems can be used with the technology proposed herein. One example memory system is a solid state drive ("SSD"); however, other types of memory systems can also be used. Memory system 100 comprises a controller 102, non-volatile memory 104 for storing data, and local memory (e.g. DRAM/ReRAM) 106. Controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, controller 102 is connected to one or more non-volatile memory die or one or more memory structures. In one embodiment, each memory die in the memory packages 104 utilize NAND flash memory (including two dimensional NAND flash memory and/or three dimensional NAND flash memory). In other embodiments, the memory package can include other types of memory; for example, the memory package can include PCM memory.

Controller 102 communicates with host 120 via an interface 130 that implements NVM Express (NVMe) over PCI Express (PCIe). For working with memory system 100, host 120 includes a host processor 122, host memory 124, and a PCIe interface 126. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
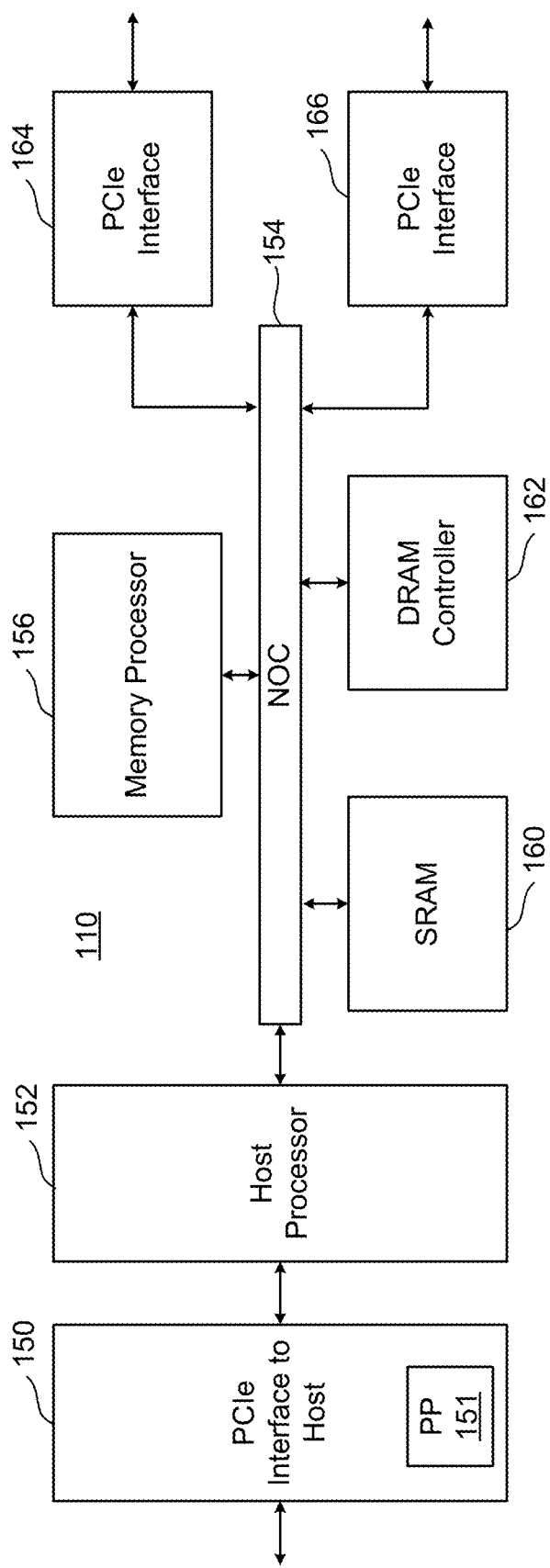
FIG. 2 is a block diagram of one embodiment of a Front End Processor Circuit. In some embodiments, the Front End Processor Circuit is part of a controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 2, controller 102 includes two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 3:
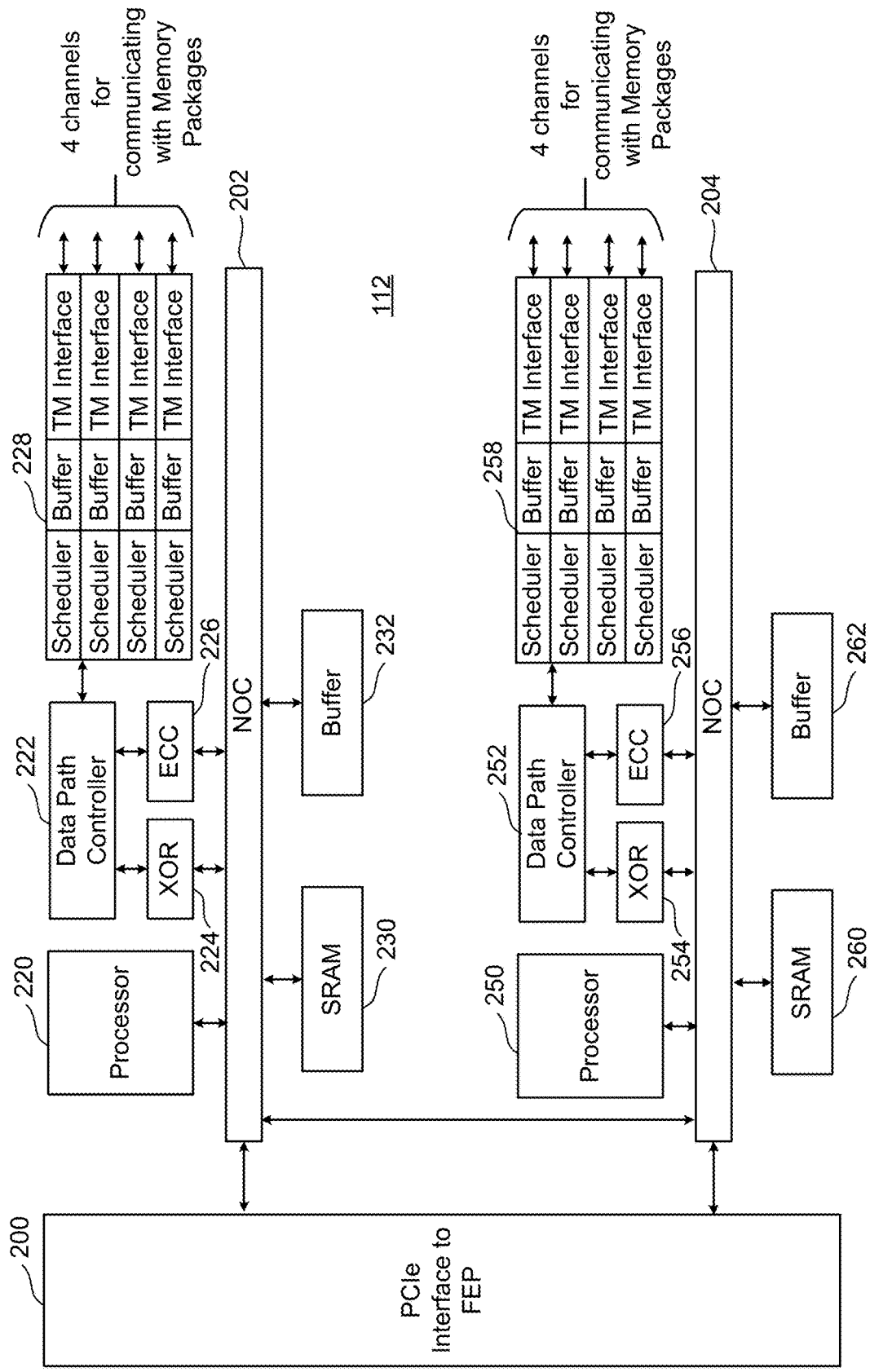
FIG. 3 is a block diagram of one embodiment of a Back End Processor Circuit. In some embodiments, the Back End Processor Circuit is part of a controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines (226/256) are used to perform error correction, as known in the art. The XOR engines 224/254 are used to XOR the data so that data can be combined and stored in a manner that can be recovered in case there is a programming error. Data path controller 222 is connected to a memory interface 228 for communicating via four channels with memory packages. Thus, the top NOC 202 is associated with memory interface 228 for four channels for communicating with memory packages and the bottom NOC 204 is associated with memory interface 258 for four additional channels for communicating with memory packages. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 3. Additionally, controllers with structures different than FIGS. 2 and 3 can also be used with the technology described herein.

Figure 4:
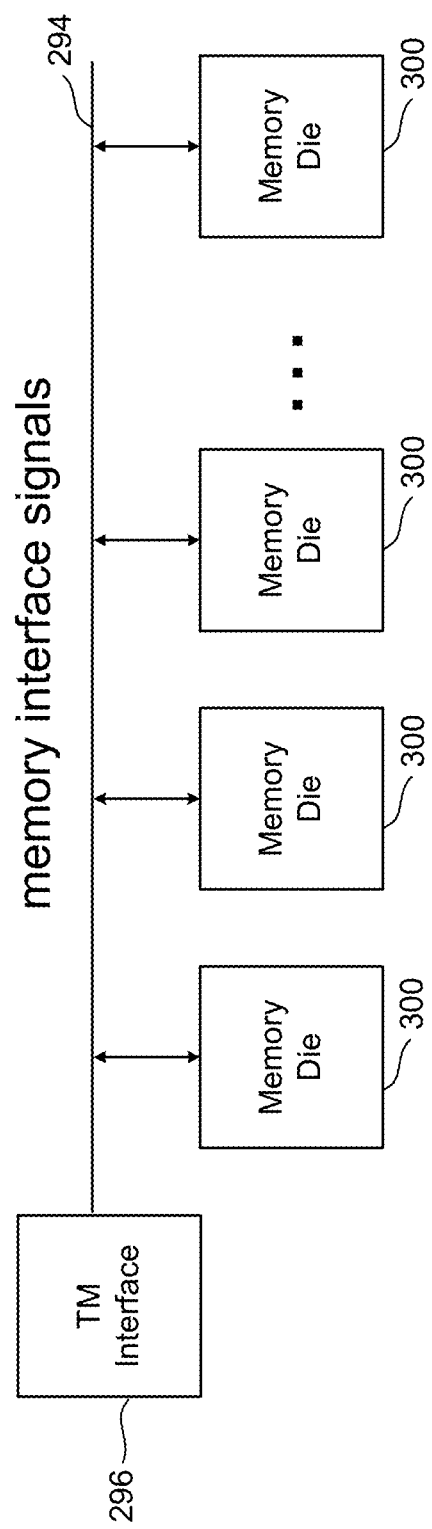
FIG. 4 is a block diagram of one embodiment of a memory package.

FIG. 4 is a block diagram of one embodiment of a memory package that includes a plurality of memory die 300 connected to a set of memory interface signals 294. The memory interface signals 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes sixteen memory die; however, other numbers of memory die can also be implemented. The technology described herein is not limited to any particular number of memory die. FIG. 4 shows that some memory systems comprise a plurality of memory dies 300 each having non-volatile memory cells that store data, where the memory dies are connected to a control circuit (e.g., controller 102 or other control circuit, such as a microprocessor, state machine, FPGA, etc.). The controller (or other control circuit) is used to transfer data to the memory dies, program the data in the memory dies, read the data from the memory dies and transfer the data read from the memory dies.

Figure 5:
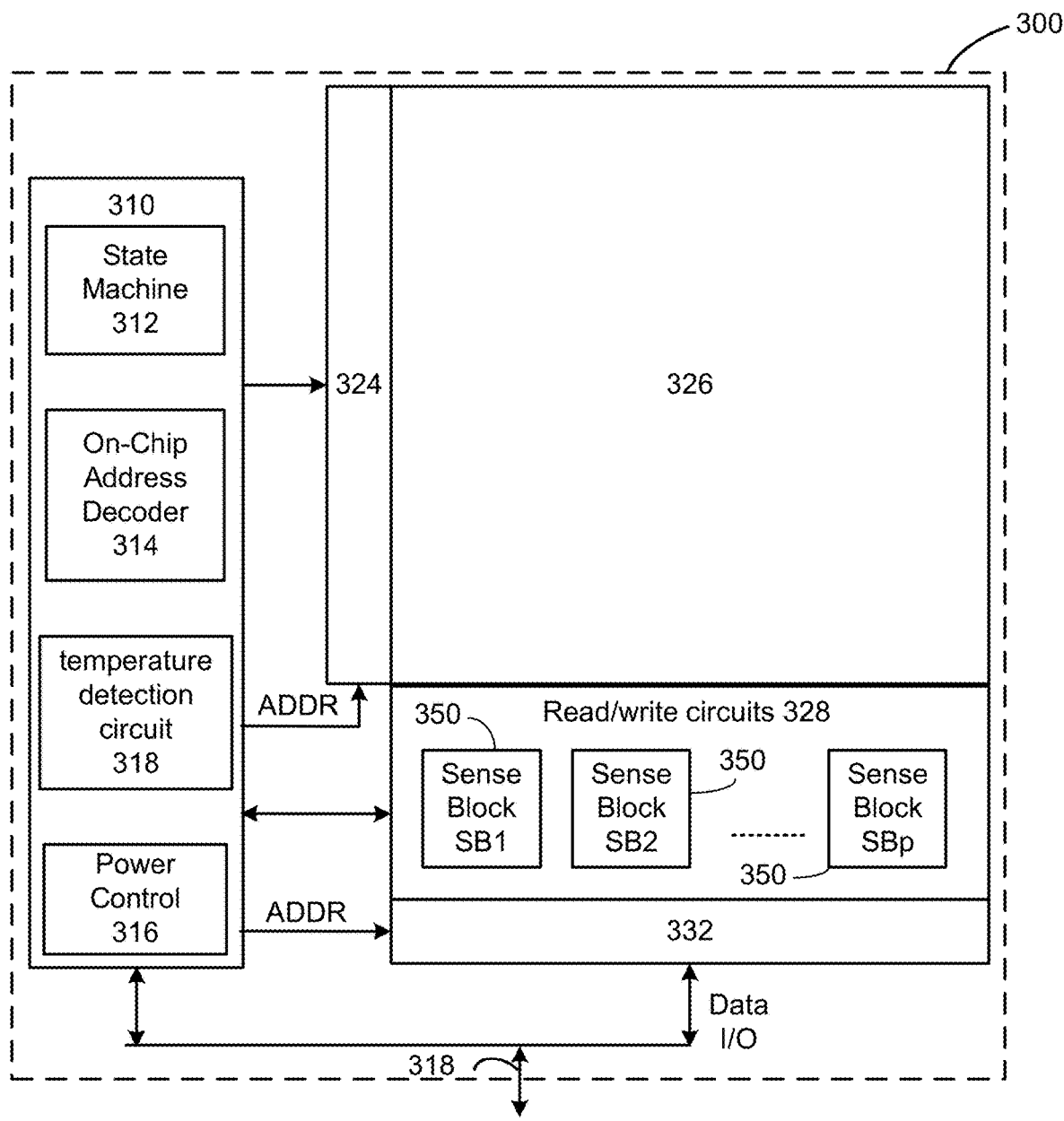
FIG. 5 is a block diagram of one embodiment of a memory die.

FIG. 5 is a functional block diagram of one embodiment of a memory die 300. Each of the one or more memory die 130 of FIG. 4 can be implemented as memory die 300 of FIG. 5. The components depicted in FIG. 5 are electrical circuits. In one embodiment, each memory die 300 includes a memory structure 326, control circuitry 310, row decoder 324, column decoder 332 and read/write circuits 328, all of which are electrical circuits. Memory structure 326 is addressable by word lines via row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred in and out of the memory die 300 via memory die interface 318, which connects to memory interface signals 294 of a memory package 104 (se FIG. 4).

Examples of memory die interface 318 include a Toggle Mode Interface and an Open NAND Flash Interface (ONFI). Other I/O interfaces can also be used. Toggle mode (e.g., Toggle Mode 2.0 JEDEC Standard or Toggle Mode 800) is an asynchronous memory interface that supports SDR and DDR with a DQS signal acting as a data strobe signal. Table 1 provides a definition of one example of a Toggle Mode Interface that can be used to implement memory die interface 318.

TABLE 1

| Signal Name | Type | Function |
|---|---|---|
| ALE | Input | Address Latch Enable controls the activating path for addresses to the internal address registers. Addresses are latched on the rising edge of WEn with ALE high. |
| CEn | | Chip Enable controls memory die selection. |
| CLE | Input | Command Latch Enable controls the activating path for commands sent to the command register. When active high, commands are latched into the command register through the I/O ports on the rising edge of the WEn signal. |
| RE | Input | Read Enable Complement |
| REn | Input | Read Enable controls serial data out, and when active, drives the data onto the I/O bus. |
| WEn | Input | Write Enable controls writes to the I/O port. Commands and addresses are latched on the rising edge of the WEn pulse. |
| WPn | Input | Write Protect provides inadvertent program/erase protection during power transitions. The internal high voltage generator is reset when the WPn pin is active low. |
| DQS | Input/Output | Data Strobe acts as an output when reading data, and as an input when writing data. DQS is edge-aligned with data read; it is center-aligned with data written. |
| DQSn | Input/Output | Data Strobe complement (used for DDR) |
| Bus[0:7] | Input/Output | Data Input/Output (I/O) signal bus inputs commands, addresses, and data, and outputs data during Read operations. The I/O pins float to High-z when the chip is deselected or when outputs are disabled. |
| R/Bn | Output | Ready/Busy indicates device operation status. R/Bn is an open-drain output and does not float to High-z when the chip is deselected or when outputs are disabled. When low, it indicates that a program, erase, or random read operation is in process; it goes high upon completion. |
| ZQ | Supply | Reference for ZQ calibration. |
| VCC | Supply | Power supply for memory die. |
| VCCQ | Supply | I/O power for I/O signals |
| VPP | Supply | Optional, high voltage, external power supply |
| VREF | Supply | Reference voltage, reserved fir Toggle Mode DDR2 |
| VSS | Supply | Ground |

In some example implementations, memory interface signals 294 of a memory package 104 (see FIG. 4) comprises the signals of Table 1; however, including multiple CEn signals (e.g., CEn0, CEn1, CEn2, . . . ). In one embodiment, memory interface signals 294 includes four CEn signals (e.g., CEn0, CEn1, CEn2, CEn3), the memory package 104 includes sixteen memory die 300, and each of the CEn signals is connected four memory die 300 of the same package. In these embodiments, the same signal bus BUS[0:7] is connected to multiple memory dies 300; therefore, the multiple CEn signals (e.g., CEn0, CEn1, CEn2, CEn3) and chip addresses (see below) are used to select a subset of memory dies for a given operation.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature detection circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, alone or in combination with read/write circuits 328 and decoders 324/332, comprise one or more control circuits for memory structure 326. These one or more control circuits are electrical circuits that perform the functions described below in the flow charts and signal diagrams. In other embodiments, the one or more control circuits can consist only of controller 102, which is an electrical circuit in combination with software, that performs the functions described below in the flow charts and signal diagrams. In another alternative, the one or more control circuits comprise controller 102 and control circuitry 310 performing the functions described below in the flow charts and signal diagrams. In another embodiment, the one or more control circuits comprise state machine 312 (or a microcontroller or microprocessor) alone or in combination with controller 102.

In one embodiment, memory structure 326 comprises a monolithic three dimensional memory array of non-volatile memory cells in which one or multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. The exact type of memory array architecture or memory cell included in memory structure 326 is not limited to the examples herein. Many different types of memory array architectures or memory cell technologies can be used to form memory structure 326. No particular non-volatile memory technology is required for purposes of the new claimed embodiments proposed herein.

In one embodiment, memory structure 326 is implemented with Phase-Change Memory ("PCM"). PCM is bit addressable non-volatile memory with direct writing, meaning that any bit can be independently reprogrammed without a need to erase a larger block of memory cells. The memory cells in a PCM memory structure include a phase change material which can be set in different phases or states that have different resistance levels. The state is maintained when no power is supplied so that the memory cells are non-volatile. Phase change materials include chalcogenides, carbon polymers, perovskites, and certain metal oxides (MeOx) and metal nitrides (MeN). In chalcogenides, a high-resistance state corresponds to an amorphous state, and a low-resistance state corresponds to a more ordered crystalline state. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. $Ge_2Sb_2Te_5$ (germanium-antimony-tellurium) is one example of a chalcogenide material.

The conversion between states is generally achieved thermally, by applying a current to the memory cell to heat it. A conversion may be induced by increasing the temperature locally. Below 150 degrees Celsius, for example, both the amorphous state and the crystalline state are reasonably stable and may retain the bit state for ten years or more. Above 200 degrees Celsius, there is an increased rate of nucleation of the crystallites and, if the material is kept at the crystallization temperature for a sufficiently long time, it undergoes a phase change and becomes crystalline. To bring the chalcogenide back to the amorphous state, the temperature is raised above the melting temperature (approximately 600 degrees Celsius for $Ge_2Sb_2Te_5$, for example) and then the chalcogenide is cooled off rapidly. The crystallization and melting temperatures can be reached by causing a current to flow through a crystalline resistive element that heats the chalcogenic material by the Joule effect.

For example, the phase change material may initially be formed in a relatively low-resistance state. Upon application of a waveform with a sufficient voltage and current, the material switches to a stable high-resistance state if the trailing edge of the waveform is fast enough, e.g., having a duration of less than 10 nanoseconds (nsec.). This resistance switching is reversible such that subsequent application of a waveform with an appropriate current or voltage returns the material to a stable low-resistance state if the trailing edge of the waveform is slow enough, e.g., having a duration of more than 100 nsec. This conversion can be repeated many times. A SET operation may refer to switching the material from high resistance (amorphous state) to low resistance (crystalline state), while a RESET operation may refer to switching the material from low resistance (crystalline state) to high resistance (amorphous state). The SET and RESET operations may both also be referred to as a write or program operations.

Examples of metal oxides and nitrides include Nickel Oxide (NiO), Niobium Oxide (Nb2O5), Titanium Dioxide (TiO2), Hafnium Oxide (HfO2), Aluminum Oxide (Al2O3), Magnesium Oxide (MgOx), Chromium Dioxide (CrO2), Vanadium Oxide (VO), Boron Nitride (BN), and Aluminum Nitride (AlN).

Phase change memory cells are of interest for use in non-volatile memory arrays. One resistance state may correspond to a data "0," while the other resistance state corresponds to a data "1." For example, the high resistance state may be used to store data "0" and the low resistance states may be used to store data "1" so that a SET operation changes a memory cell from 0 to 1, and a RESET operation changes a memory cell from 1 to 0.

Some of these materials may have more than two stable resistance states. Moreover, in a memory cell, the phase change material can be in series with a selection element (also referred to as a steering element) which selectively limits the voltage across, and/or the current flow through, the phase change material. Examples of a selection element include a transistor, a diode and an ovonic threshold switch (OTS). A selection element may or may not allow current to flow in only one direction through the memory cell. If current is allowed by the selection element (selector) in either direction, the element may require a "turn-on" condition to a low resistance state and otherwise remain in a high resistance state. A transistor may require a control signal exceeding Vth to turn it on. A diode or OTS may require the voltage across the memory cell to exceed Vth; otherwise, the selection element remains "off" or in a relatively high resistance state. The selection element itself is not typically a resistance-change material and may not have memory of prior operations. Instead, the selection element allows a memory cell to be written to, and/or read from, without affecting the state of other memory cells in an array.

Memory cells are implemented as an array of memory cells arranged in rows and columns. The write process involves biasing a selected memory cell via a selected word line and a selected bit line to provide a write current through the selected memory cell. The word lines and bit lines are also referred as control lines. The unselected memory cells are biased to prevent a current flowing through them through unselect conditions that do not turn on their selection element. For example if the selection element is an OTS, an equal voltage can be provided on the unselected word line and bit line which are connected to an unselected memory cell. This results in no bias across the memory cell. In one approach, a transistor which is connected to each unselected word line and bit line is controlled to bias each unselected word line and bit line. More information about PCM can be found in U.S. patent application Ser. Nos. 15/855,903 and 15/869,553, both of which are incorporated herein by reference in their entirety.

Figure 6A:
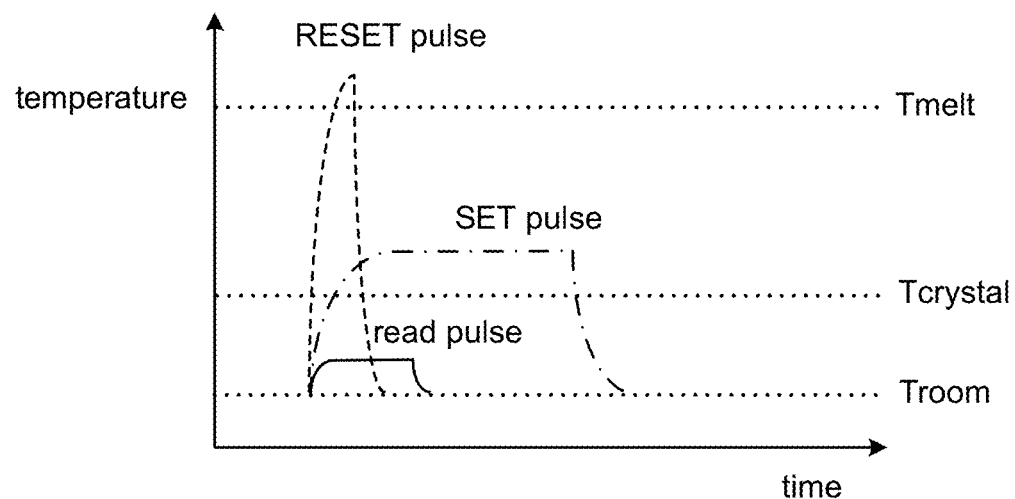
FIG. 6A is a graph of time versus temperature.

FIG. 6A is a graph (time versus temperature) that depicts the electrical pulses applied to the PCM memory cell to perform SET, RESET and READ operations. As seen from FIG. 6, the SET operation is longer in time than the RESET operation. FIG. 6A shows the SET pulse being significantly wider than the RESET pulse. In some cases, a SET operation (amorphous state to crystalline state) can take up to eight times longer than a RESET operation. (crystalline state to amorphous state). As such, a PCM device exhibits asymmetrical performance when programming/writing.

Because RESET operations are faster than SET operations, it is proposed to operate the memory such that more RESET operations are performed than SET operations. Data shaping can be used to cause more RESET operations than SET operations. For purposes of this document, data shaping is encoding or mapping of data from input values to output values such that the output values have a desired property. In one embodiment, the desired property is that there are more zeroes being written than ones.

Data to be stored in the flash memory may be considered as a binary string. When the data is compressible (i.e. suitable for data shaping), choosing an integer "m" and partitioning the input data string into substrings of length m will result (with a high probability) in a non-uniform distribution of the $2^m$ substrings of length m in the data. As an example, for m=3, the 8 substrings 000, 001, 010, 011, 100, 101, 110, 111 are likely non-uniformly distributed in the input data if the input data is compressible.

Given compressible input data, the input data may be partitioned into substrings of length m, where m is a predefined integer, and a substitution mapping may be applied to the substrings of length m, such that each substring is mapped to a (possibly different) substring of length m. The substitution may be a permutation of the substrings of length m, and the specific permutation may be defined to satisfy some logical condition. For example, the permutation may be a shaping permutation to reduce a distribution of ones in the transformed string. A predefined ordering may be applied to the substrings according to a particular logical condition, (e.g., the first substring may be 000 . . . 0, followed by the m substrings with one appearance of 1, followed by the substrings with two appearances of 1 in a substring etc. until the last substring may be all 1s). In addition, a dynamic ordering may be defined according to a distribution of the substrings in the input data, such that a most popular substring may be first, followed by all the other substrings according to their popularity. In case of a tie, the order can be decided in any specified way, such as by using a random choice. The two sequences of substrings (i.e. the sequence according to the predefined ordering and the sequence according to the dynamic ordering) can be linked such that the permutation will map the ith substring in the second sequence to the ith substring in the first sequence.

In one embodiment, data shaping may include dividing a length n input bit sequence into m bit strings and counting how many strings exist from each type (i.e. generate $2^m$ counters). A one-to-one mapping function from input strings sorted from the most frequent to the least frequent, according to the 2m counters, into output strings sorted according to a descending number of 0's in the string (i.e. from the all 0's string to the all 1's string) may be defined. The mapping function may be used to map each input string into an output string. The resulting bit sequence may be output together with the $2^{m*}m$ bits that define the mapping function that was used for converting the input bit sequence into the output bit sequence.

Figure 6B:
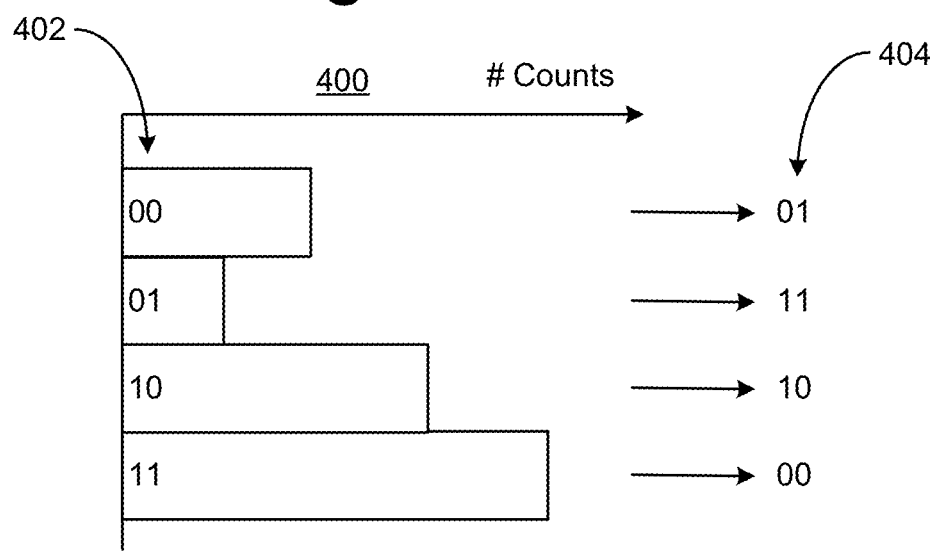
FIG. 6B is a histogram showing one example of frequency of occurrence for data values.

FIG. 6B illustrates a particular embodiment of a data shaping 400 of input substrings 402 to output substrings 404 for m=2. A histogram may be generated based on counting how many times each two bit substring appears in an input sequence. The most frequent input substring 11 is mapped to the output substring 00. The next most frequent input substring 10 remains as 10. The third most frequent input 00 is mapped top 01. The least frequent input substring 01 is mapped to the output substring 11. As a result of this mapping, the number of 0's in the output sequence is larger than the number of 0's in the input sequence.

After the data shaping is applied to the substrings, the shaped data may be stored in a the memory cells. In some embodiments, a key to the mapping may also be stored with the shaped data. The above examples of data shaping are not exhaustive and other data shaping schemes can also be used. More information about data shaping can be found in United States Patent Application 2013/0103891, incorporated herein by reference in its entirety.

As discussed above, the data shaping is designed such that the data to be stored in the memory has more zeros than ones. The mapping function can be designed to achieve different proportions of zeros to ones. Additionally, different input strings may cause different proportions of zeros to ones. The different proportions of zeros to ones are referred to as shaping levels. For example, based on the input string, a system may implement four different shaping levels: (1) 90% zeros, 10% ones; (2) 75% zeros, 25% ones; (3) ⅔ zeros, ⅓ ones; (4) 50% zeros, 50% ones. Other shaping levels can also be used.

One property of a chunk of data is its entropy, which is a measure of how well (or how much) the chunk of data can be compressed or shaped. More specifically, entropy refers to the amount of disorder or uncertainty in data. In one example embodiment, entropy is expressed as a number between 0 and 1, where 0 represents data with the most certainty (e.g., easier to guess what the next data will be) and 1 represent data with no certainty (completely random data).

The basic idea of information theory is the more one knows about a topic, the less new information one is apt to get about it. If an event is very probable, it is no surprise when it happens and thus provides little new information. Inversely, if the event was improbable, it is much more informative that the event happened. Therefore, the information content is an increasing function of the inverse of the probability of the event (1/p). Now, if more events may happen, entropy measures the average information content one can expect to get if one of the events actually happens. This implies that casting a die has more entropy than tossing a coin because each outcome of the die has smaller probability than each outcome of the coin. Thus, entropy is a measure of unpredictability of the state, or equivalently, of its average information content.

In one example embodiment, if there is a set of k different values, then entropy can be calculated as follows:

$$\text{entropy}(\text{Set}) = -\sum_{i=1}^{k} P(value_i) \cdot \log_2(P(value_i))$$

where $P(value_i)$ is the probability of getting the ith value when randomly selecting one from the set.

So, for example, for the set R={h,h,h,l,l,l,l,l}:

$$\text{entropy}(R) = -\left[\left(\frac{3}{8}\right)\log_2\left(\frac{3}{8}\right) + \left(\frac{5}{8}\right)\log_2\left(\frac{5}{8}\right)\right]$$

When a mapping function for data shaping is applied to different data chunks with different entropy values, the output of the data shaping may be at different shaping levels. It is typical that over an entire population of data stored in a memory system (such as all data stored in an SSD) that there will be data chunks with different entropy values. Data chunks with different entropy values will cause non-uniformity of shaping levels across the memory. As described in more detail below, non-uniform placement of different shaping levels across the memory will provide degraded utilization of the programming reduction potential.

To take advantage of data shaping and increase programming throughput (and reduce power needed for programming), it is proposed to divide the PCM memory into several partitions. Each of the partitions is preassigned to a shaping level such that all of the data chunks stored in that partition are shaped at the same shaping level (and, in most cases, targeted to increase the number of RESET operations). Each data chunk received from the host will be shaped based on its entropy to one of a predefined number of shaping levels and stored in the partitions preassigned to that shaping level.

Figure 7:
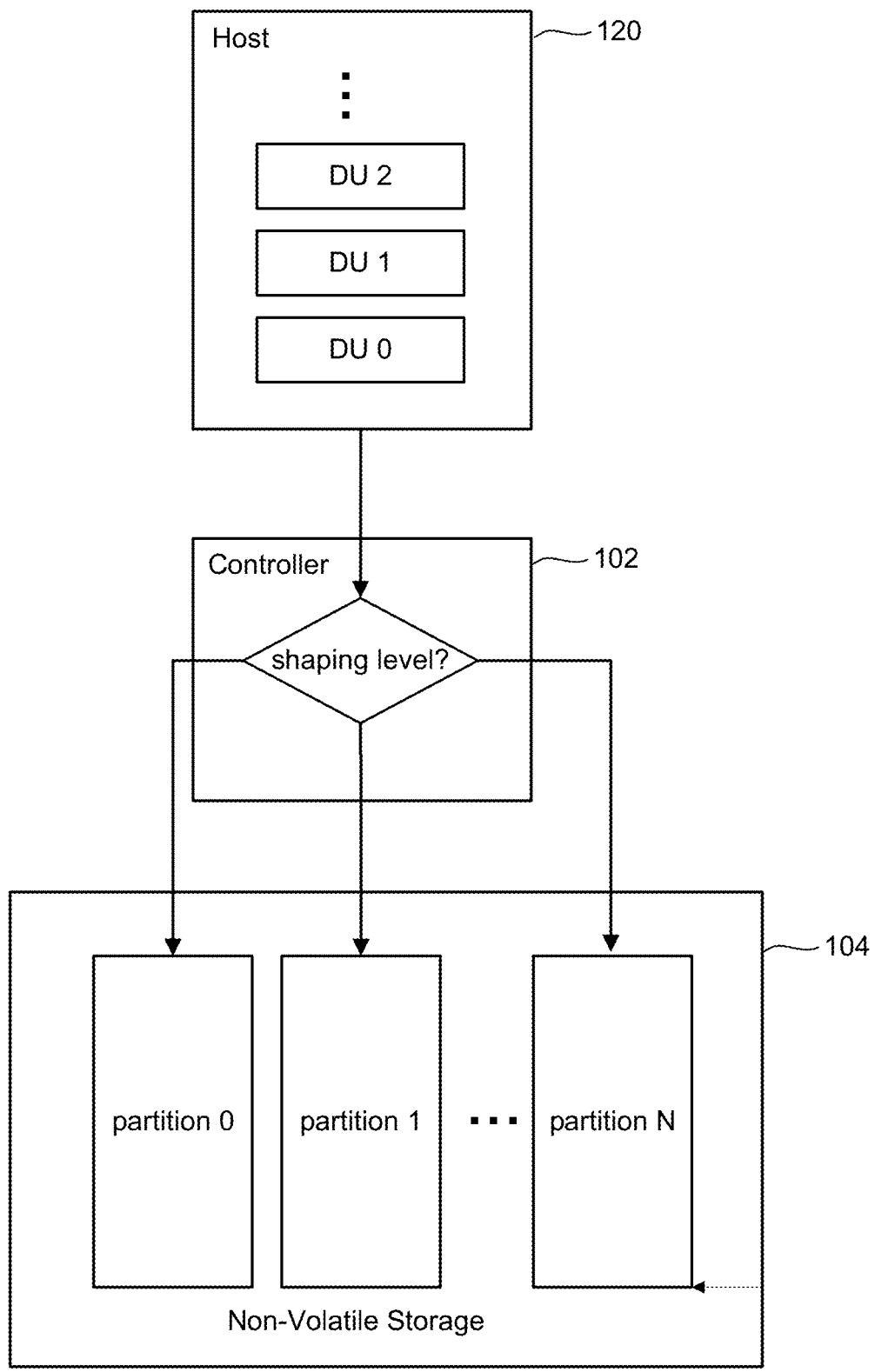
FIG. 7 is a block diagram of one example implementation of the memory system.

FIG. 7 is a block diagram of the memory system depicted in FIG. 1, explaining the technology proposed herein. In FIG. 7, non-volatile storage 104 comprises non-volatile memory cells organized into multiple physical partitions (partition 0, partition 1, . . . , partition N). The partitions can be portions of a memory array, portions of a plane of memory, portions of multiple memory arrays or portions of multiple memory dies, etc. A partition can include one or multiple blocks. Each partition is preassigned to a different shaping level. Controller 102 (which is one example of a control circuit) is connected to the non-volatile storage and configured to write shaped data to a partition of the multiple physical partitions that is preassigned to a same shaping level as the shaped data.

FIG. 7 shows host 120 accessing a set of units of data (DU 0, DU 1, DU 2, . . . ). Each unit of data is a chunk of data that will be written to the memory 104. The technology described herein is not limited to any particular size of data. The unit of data to be written to memory 104 is transmitted to controller 104. Based on the shaping level, controller 102 will program the unit of data into the appropriate partition (e.g., partition 0, partition 1, . . . , partition N) assigned to the same shaping level as the unit of data. Some memory system will only have two partitions, while other memory systems can have many partitions. In one embodiment, each partitions is assigned to a different shaping level. In other embodiments, more than one partition can be assigned to a shaping level. More details of the operation of the structure of FIG. 7 is provided below with respect to FIGS. 9-16.

FIG. 8 shows two sets of shaped data 420 and 422 that are at different shaping levels. Set of shaped data 420 is at a first shaping level that includes 90% zeros and 10% ones. Set of shaped data 422 is at a second shaping level that includes 50% zeros and 50% ones. Referring back to the structure of FIG. 7, controller 102 will program set of shaped data 420 to one partition (e.g., partition 0) and controller 102 will program set of shaped data 422 to another partition (e.g., partition 1). In this example, all data shaped to the a first shaping level will be stored in partition 0 and all data shaped to the a first shaping level will be stored in partition 1.

By storing shaped data in a partition that is already storing shaped data at the same shaping level, it is more likely that a particular bit will not need to be programmed. For example, if a partitions has been storing data at a first shaping level that includes 90% zeros and 10% ones, then when new data is to be stored over old (e.g., stale) data, there is a very high chance that a bit that is to be RESET to 0 is already at 0 so no programming needs to occur for that bit (thereby saving power and time).

Use of partitions to store data within each partition at the same shaping level increases performance (i.e. speed and power) of the programming/write process. To show an example of the performance improvement using a qualitative calculation, it is assumed that the data transferred to the non-volatile storage (e.g., PCM Memory) is to be shaped to one of two potential predetermined shaping levels: (1) 90% RESET states (noted here as a logical value of 0) and 10% SET states (logical value of 1) or (2) an equal distribution (50% RESET and 50% SET). It is further assume that 50% of the overall data at the non-volatile storage belongs to the 90/10 shaping distribution (Type 1 in FIG. 8—see set of data 420), and the other 50% belong to the equal 50/50 distribution (Type 2 in FIG. 8—see set of data 422).

It is further assumed (without the loss of generality) that the programming duration of a SET operation is 8 times longer than the programming during of a RESET operation. In particular, assume RESET programming (i.e. logical transition from 1→0) cost on average 1 usec, while the SET programming (i.e. logical transition from 0→1) cost on average 8 usec.

$P_0^B$ the probability to get 0 before programming at the target cell, and $P_0^A$ will indicate the same probability to 0 after programming.

Under these notations:

The average duration (or cost) for the 1→0 transition (considering the relative portions of 0's and 1's in each data type is noted by:

$(1-P_0^A)*P_0^B*8$ [usec]

The average duration (or cost) for the 0→1 transition (considering the relative portions of 0's and 1's in each data type is noted by:

$P_0^A*(1-P_0^B)*1$ [usec]

The analysis will examine the averaged programming duration for 3 different scenarios:
1. Reference—at which no shaping is used (such that on average the 0's and 1's portion are equal over all storage areas).
2. Unified shaping—represents a shaping approach where there is no division into different partitions based on the shaping level, such that the shaped data chunks are spread randomly over all the storage area.
3. RESET-Shaping Memory Partition—the new concept proposed herein where the system allocates a different partition for each shaping level. In this simplified example—assume that the system allocates one partition for the 90/10 shaping ratio data (shaping level 1), and a different partition for the data with shaping ratio of 50/50 (shaping level 2).

The overall duration ("cost") for the different approaches are calculated as set forth below. The table below shows the average duration for a programming operation based on the relative probability to get the different transitions (0→1, 1→0) according to the 0/1 appearance distribution, and the average cost per each transition, as follows:

TABLE

Average programming latency of different methods

| Method | Calculation of Averaged Programming Duration | Result |
| --- | --- | --- |
| Reference (no shaping) | 1*Pr(0→1) + 8*Pr(1→0) + 0*Pr(0→0) + 0*Pr(1→1) = 1*(0.5*0.5) + 8*(0.5*0.5) | 2.25 |
| Unified shaping (old method) | 1 * Pr(0→1) + 8 * Pr(1→0) + 0 * Pr(0→0) + 0 * Pr(1→1) = 1* ($P_0^B$ * $P_1^A$) + 8 * ($P_1^B$ * $P_0^A$) = 1 * {(0.5 * 0.5 + 0.5 * 0.9) * (0.5 * 0.5 + 0.5 * 0.1)} + 8 * {(0.5 * 0.5 + 0.5 * 0.1) * (0.5 * 0.5 + 0.5 * 0.9)} | 1.89 |
| RESET-Shaping Memory Partition (new concept proposed) | 1*Pr(0→1) + 8*Pr(1→0) = {1*[(0.9*0.1) + (0.5*0.5)] + 8*[(0.1*0.9) + (0.5*0.5)]}/2 = (0.34 + 2.72)/2 | 1.53 |

Under the mentioned above assumptions of the example test case, the technology proposed for data shaping with corresponding partitions hereby presents a meaningful improvement of the averaged programming duration, of up to 32% reduction of the averaged programming duration versus the reference method, and up to 19% reduction of programming time versus non-partition shaping.

Figure 9:
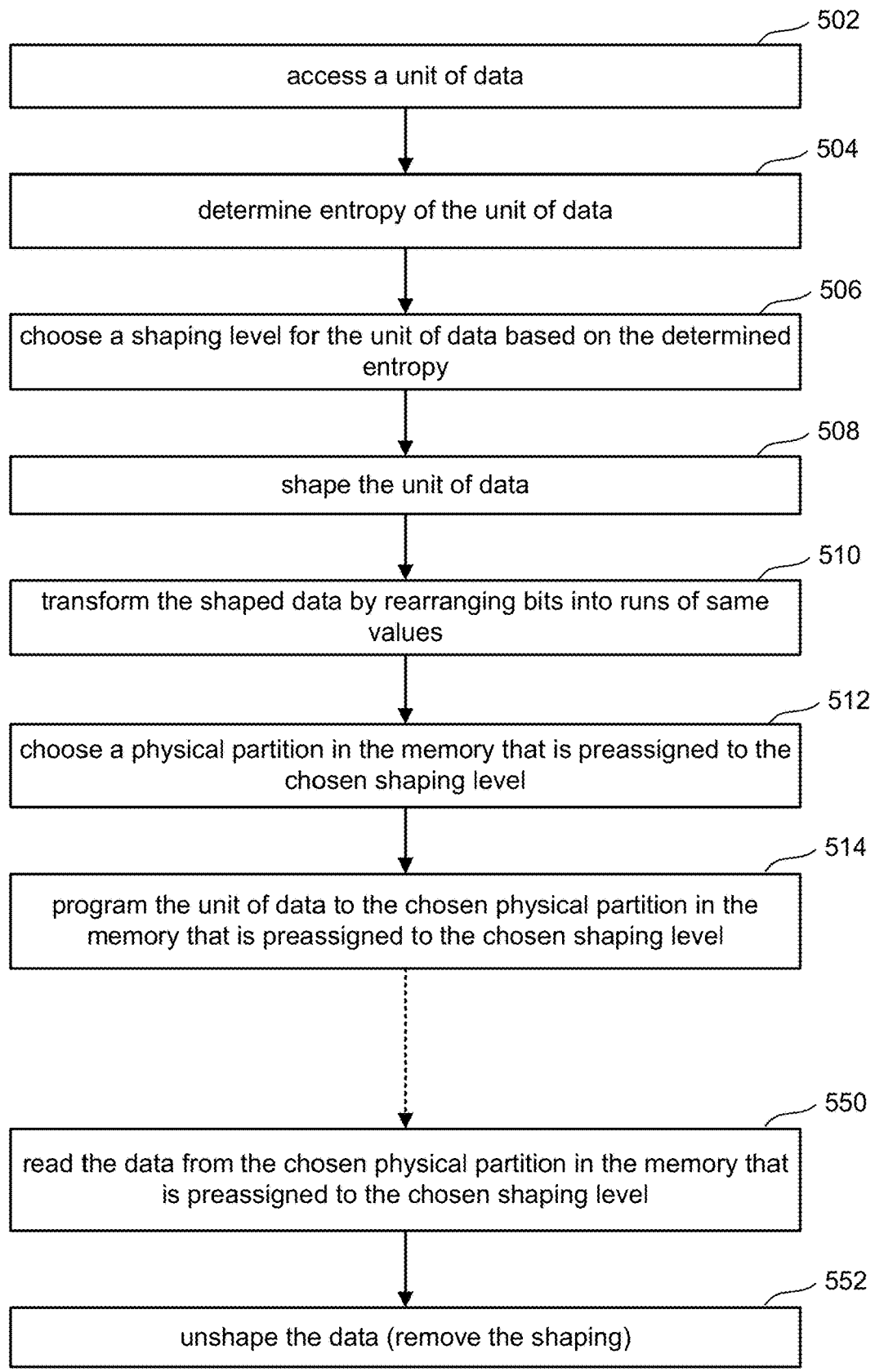
FIG. 9 is a flow chart describing one embodiment of a process for writing and reading data.

FIG. 9 is a flow chart describing one embodiment for operating the structure of FIG. 7 to perform writing and reading using the proposed technology for data shaping with corresponding partitions. The process of FIG. 9 can be performed by a host, a controller, and/or one or more control circuits on the memory die. In step 502 a unit of data is accessed. For example, any of the data units DU 0, DU 1, . . . can be accessed for programming. In step 504, the entropy for the accessed unit of data is determined. For example, the equation set forth above (or a different method) can be used by the host, the controller, the memory die or another entity to calculate entropy. In step 506, a shaping level is chosen for the unit of data based on the determined entropy. In some examples, the entropy determined is an indication of the maximum shaping that can be accomplished, and then the system uses that information to choose a shaping level from a set of predetermined shaping levels. As discussed above, one embodiment includes predetermining a set of shaping levels and dividing the non-volatile memory into a set of partitions with each partition assigned to a different shaping level. So there may not be a predetermined shaping level for every possible entropy; therefore, the system will choose the best fit. In the example above with two shaping levels (90/10 and 50/50), any data that can achieve 90/10 will be assigned to 90/10, with the remaining data assigned to 50/50. If data is assigned to a shaping level 90/10, then in some embodiments that data is shaped to exactly 90/10 while in other embodiments that data is shaped to 90/10 or better. The shaping level can be chosen by the host, the controller or the memory die. In step 508, the data is shaped to achieve the shaping level chosen in step 506. The data shaping can be performed by the host, the controller or the memory die.

In step 510, the shaped data is transformed by rearranging bits into runs of same values. Step 510 is optional and only performed in certain embodiments. In some memory systems, multiple memory cells are programmed simultaneously and if any one of those memory cells are undergoing a SET operations then the programming process for all memory cells being simultaneously programmed must wait for the SET operation to complete. In such an embodiment, the data shaping technology described herein will reduce power during programming but the improvement in speed will be reduced. To remedy this issue, it is proposed to rearrange bits of data (transform the data) so that the set of memory cells being programmed simultaneously are being programmed to the same data (e.g., all 0's or all 1's).

One example of transforming (rearranging of bits) is a Burrows-Wheeler transform (BWT) which is reversible without needing to store any additional data. See Burrows, Michael and Wheeler, David J., "A Block Sorting Lossless Data Compression Algorithm," Technical Report 124, Digital Equipment Corporation (1994). When a character string is transformed by the BWT, the transformation permutes the order of the characters. If the original string had several substrings that occurred often, then the transformed string will have several places where a single character is repeated multiple times in a row. The transform is done by sorting all the circular shifts of a text (e.g., which can include a string of digits) in lexicographic order and by extracting the last column and the index of the original string in the set of sorted permutations of the input string. For example, given an input string S of length N, rotate S for N times. These rotations, or circular shifts, are then sorted lexicographically into a N by N table, with each row representing one of the rotations and each column having one digit. The output of the encoding phase is the last column. The transforming of step 510 can be performed by the host, the controller or the memory die.

In step 512, a partition is chosen for storing the shaped and transformed data. In one embodiment, there is one partition for each predetermined shaping level so step 512 comprises identifying the partition preassigned to the shaping level chosen in step 506. In other embodiments, more than one partition can be preassigned to a shaping level; therefore, step 512 comprises choosing one of those partitions. The choosing of step 512 can be performed by the host, the controller or the memory die.

In step 514, the controller (and/or other control circuit) programs/writes the shaped and transformed data into the chosen partition (preassigned to the chosen shaping level) in the non-volatile memory (e.g., PCM).

Sometime after the unit of data is programmed, the host will request that the data be read. This uncertainty as to when the read will be requested is depicted graphically in FIG. 9 by a dotted arrow between steps 514 and 550. In step 550, the shaped and transformed data is read from the physical partition in the memory that is preassigned to the chosen shaping level storing the data. After reading the data, the shaping is removed in step 552 (e.g., unshape the data). If the data was transformed in step 510, then the transformation is reversed prior to removing the shaping in step 552. The removing of the shaping and the reverse transforming can be performed by the host, the controller or the memory die.

Figure 10:
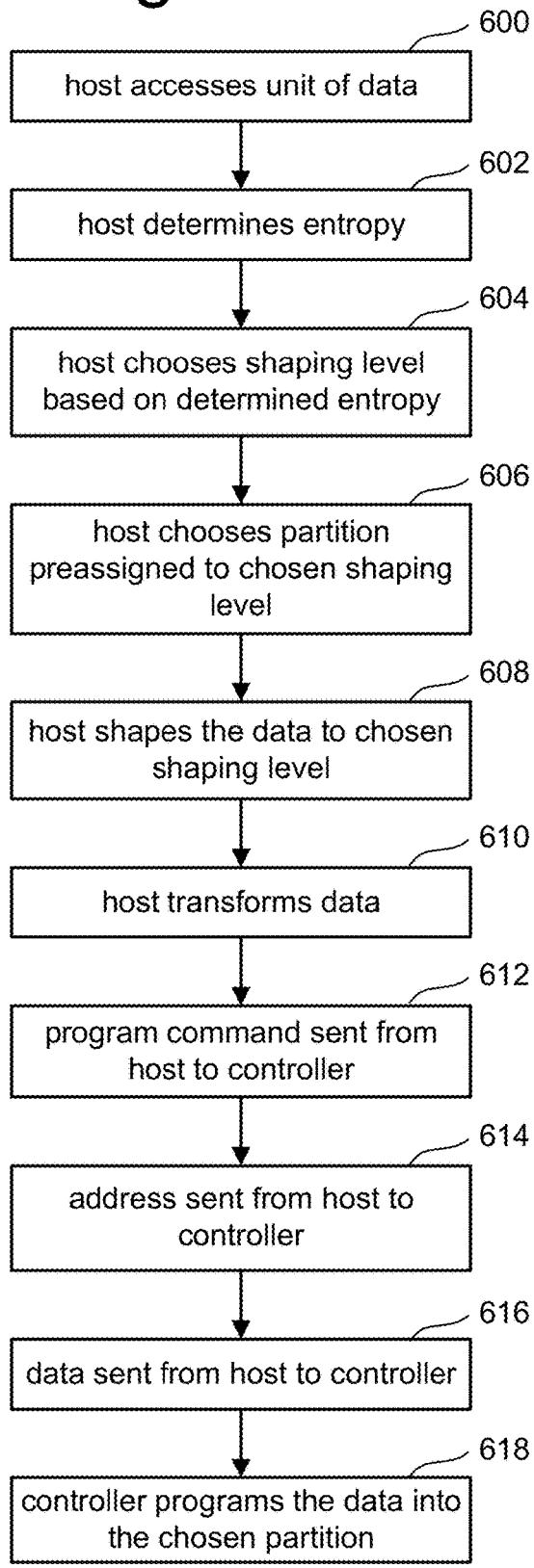
FIG. 10 is a flow chart describing one embodiment of a process for writing data.

In different embodiments, the steps of FIG. 9 can be performed by either the controller or the host. FIGS. 10-16 are flow charts that describe writing or reading for different embodiments that divide the work up differently between the host and controller. For example, FIG. 10 is a flow chart describing one embodiment for writing using the proposed technology for data shaping with corresponding partitions. The process of FIG. 10 is one example implementation of steps 502-514 of FIG. 9 for an embodiment in which the host determines the entropy and shapes the data.

In step 600 of FIG. 10, the host accesses a unit of data. For example, host 120 access DU 0. In step 602, the host determines the entropy for the accessed data; for example, using the equation above. In step 604, the host chooses a shaping level based on the determined entropy. In step 606, the host chooses a partition that is preassigned to the chosen shaping level. In step 608, the host shapes the accessed unit of data to the chosen shaping level. In step 610, the host transforms the shaped data (e.g., using a Burrows-Wheeler transform or other suitable transformation) by rearranging the bits into runs of same values. In step 612, the host sends a command to the controller to cause a programming operation. In step 614, the host sends and address to the controller, where the address points to a location in the memory for the programming operation. The address is in a host memory space. In some embodiments, the address transmitted by the host is a logical address that will be converted to a physical address in the memory by the controller. In step 616, the shaped and transformed data is transmitted from the host to the controller. In one embodiment, steps 612-616 include the host sending commands and data, and the controller receiving the command and data, over an interface as discussed above. In step 618, the controller programs the received shaped and transformed data into the memory at the received address and in the chosen partition.

In the embodiment of FIG. 10, the host is aware of the predetermined shaping levels and which partitions are preassigned to which shaping levels. Therefore, the host will choose an address (see step 614) in the chosen partition. In this manner, the address is an indication of the chosen partition.

Figure 11:
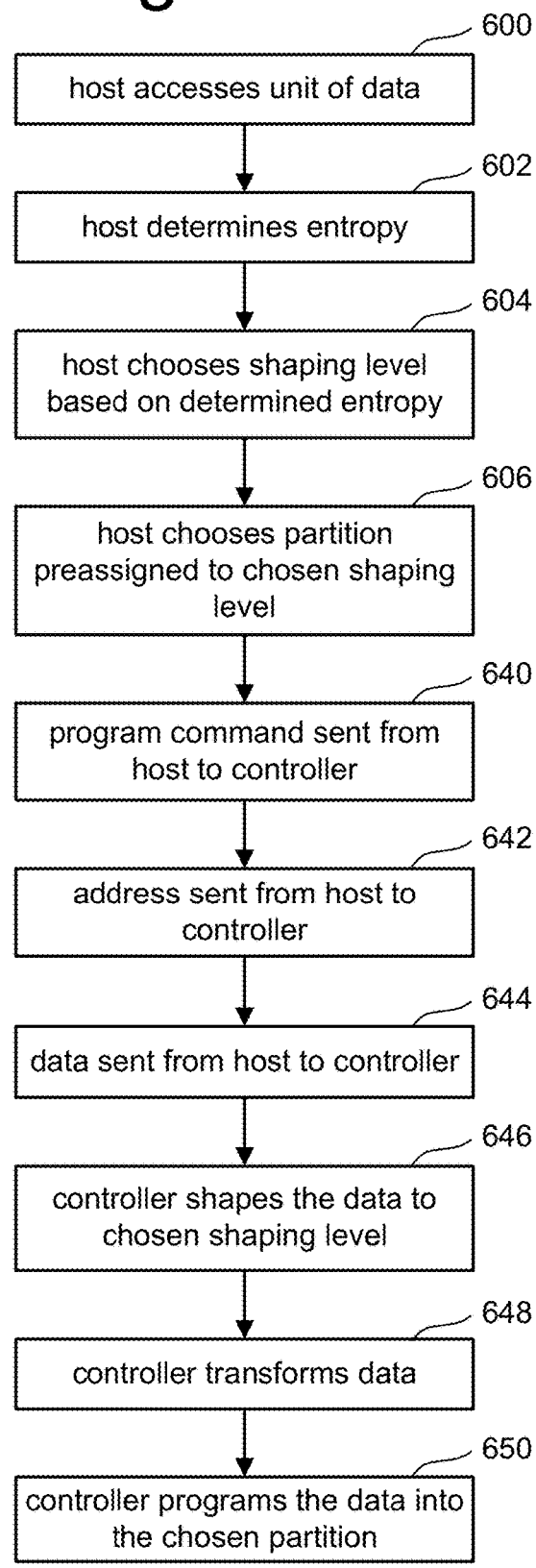
FIG. 11 is a flow chart describing one embodiment of a process for writing data.

FIG. 11 is a flow chart describing another embodiment for writing using the proposed technology for data shaping with corresponding partitions. The process of FIG. 11 is one example implementation of steps 502-514 of FIG. 9 for an embodiment in which the host determines the entropy but the controller shapes the data. As in FIG. 10, the host is aware of the predetermined shaping levels and which partitions are preassigned to which shaping levels; therefore, the host will choose an address (see step 614) in the chosen partition. Steps 600-606 of FIG. 11 are the same as FIG. 10, so that the host determines the entropy, chooses the shaping level and chooses the partition.

In step 640 of FIG. 11, the host sends a command to the controller to cause a programming operation. In step 642, the host sends an address to the controller, where the address points to a location in the memory for the programming operation. The address is in a host memory space. In some embodiments, the address transmitted by the host is a logical address that will be converted to a physical address in the memory by the controller. In step 644, the unshaped data is transmitted from the host to the controller. In step 646, the controller shapes the data to the shaping level chosen by the host. Thus, the host must send to the controller an indication of the chosen shaping level. This indication could be a data variable transmitted from the host to the controller or it can be inferred from the address. In step 648, the controller transforms the shaped data by rearranging the bits into runs of same values. In step 650, the controller programs the received shaped and transformed data into the memory at the received address and in the chosen partition.

Figure 12:
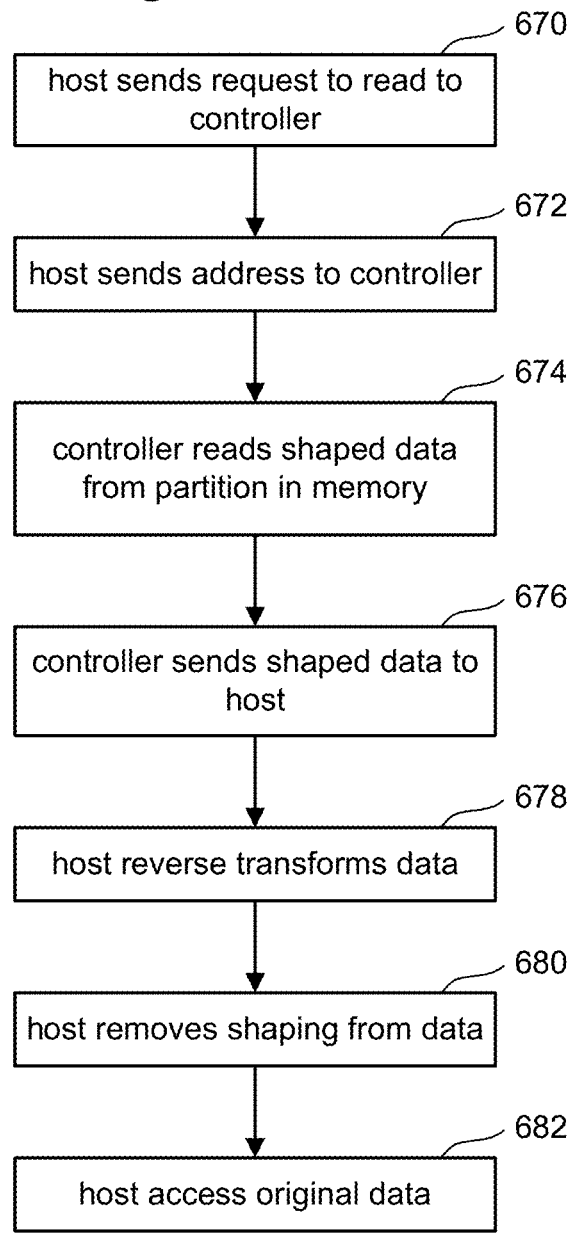
FIG. 12 is a flow chart describing one embodiment of a process for reading data.

FIG. 12 is a flow chart describing an embodiment for reading using the proposed technology for data shaping with corresponding partitions. The process of FIG. 12 is one example implementation of steps 550-552 of FIG. 9 for an embodiment in which the host determines the entropy and shaping level, and chooses the address such that the data will be programmed into the proper partition. The process for reading of FIG. 12 can be used with the processes of writing depicted in FIGS. 10 and 11.

In step 670 of FIG. 12, the host sends a request to read data to the controller. In step 672, the host sends an address to the controller for the read operation. The address is for a location in the appropriate partition. In step 674, the controller reads the data at the address. The data is read from the appropriate partition in the memory because the host is managing the shaping and chooses an address based on which partition is preassigned to the shaping level (performed during the writing process). In step 676, the controller sends the read shaped data to the host. In step 678, the host reverses the transform. In step 680, the host removes the shaping to recover the original data. In step 682, the host has access to the original data.

Figure 13:
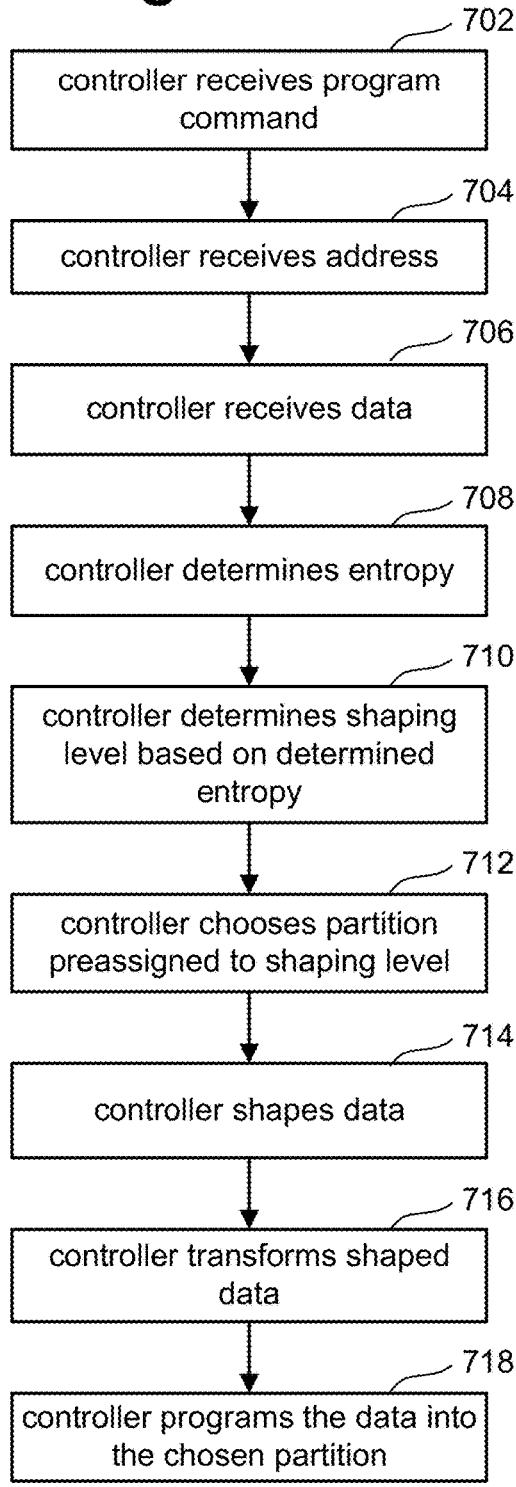
FIG. 13 is a flow chart describing one embodiment of a process for writing data.

FIG. 13 is a flow chart describing one embodiment for writing using the proposed technology for data shaping with corresponding partitions. The process of FIG. 13 is one example implementation of steps 502-514 of FIG. 9 for an embodiment in which the controller determines the entropy and shapes the data. In step 702 of FIG. 9, the controller receives a command to program data. In step 704, the controller receives an address to program the data. In step 706, the controller receives the data to be programmed. In one embodiment, the controller receives the command, address and data from the host (or other entity). In step 708, the controller determines the entropy for the received data, as discussed above. Based on the determined entropy, the controller determines the shaping level in step 710. In step 712, the controller chooses a partition that is preassigned to the chosen shaping level. In step 714, the controller shapes the received data. In step 716, the controller transforms the shaped data by rearranging bits into runs of same values. In step 718, the controller programs the shaped and transformed data into the chosen partition.

Figure 14:
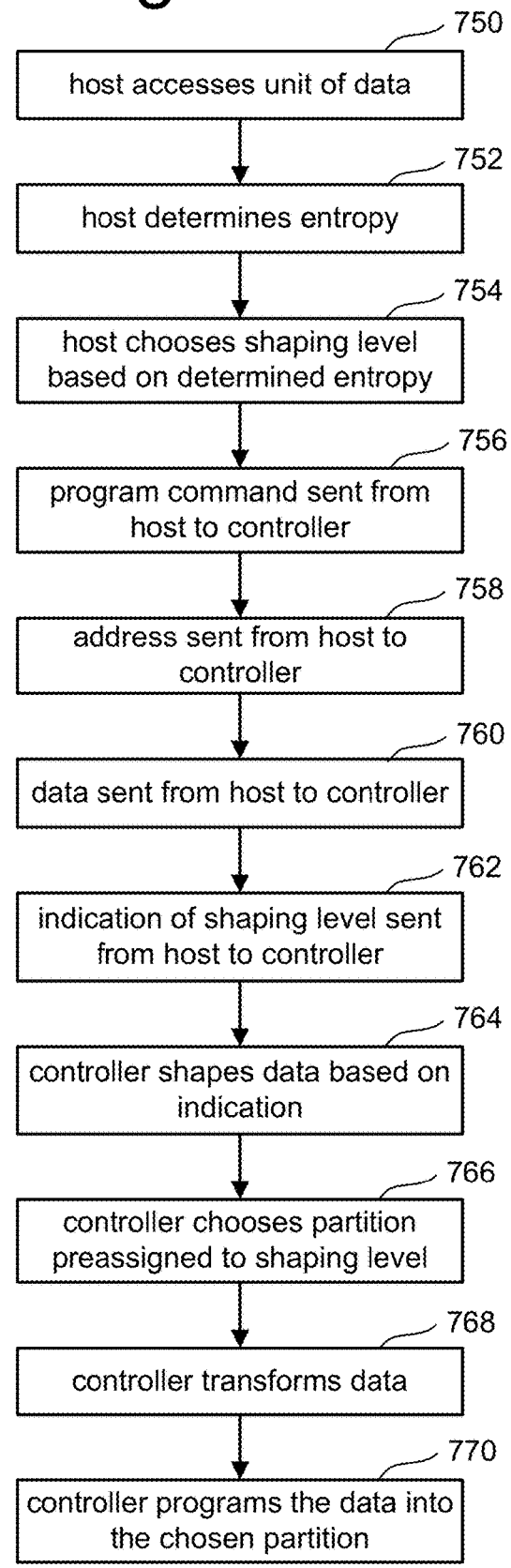
FIG. 14 is a flow chart describing one embodiment of a process for writing data.

FIG. 14 is a flow chart describing another embodiment for writing using the proposed technology for data shaping with corresponding partitions. The process of FIG. 14 is one example implementation of steps 502-514 of FIG. 9 for an embodiment in which the host determines the entropy, and the controller chooses the partition and shapes the data. In step 750, the host accesses a unit of data. In step 752, the host determines the entropy of the data. In step 754, the host chooses a shaping level for the data based on the entropy. Steps 750-754 are similar to step 600-604 of FIG. 10. In step 756, the host sends a command to the controller to cause a programming operation. In step 758, the host sends an address to the controller, where the address points to a location in the memory for the programming operation. The address is in a host memory space. In some embodiments, the address transmitted by the host is a logical address that will be converted to a physical address in the memory by the controller. In step 760, the unshaped data is transmitted from the host to the controller. In step 762, the host sends to the controller an indication of the shaping level chosen in step 754. This indication could be a data variable transmitted from the host to the controller or it can be inferred from the address. In step 764, the controller shapes the data to the shaping level chosen by the host. In step 766, the controller chooses a partition preassigned to the chosen shaping level. In step 768, the controller transforms the shaped data by rearranging the bits into runs of same values. In step 770, the controller programs the received shaped and transformed data into the memory in the chosen partition.

Figure 15:
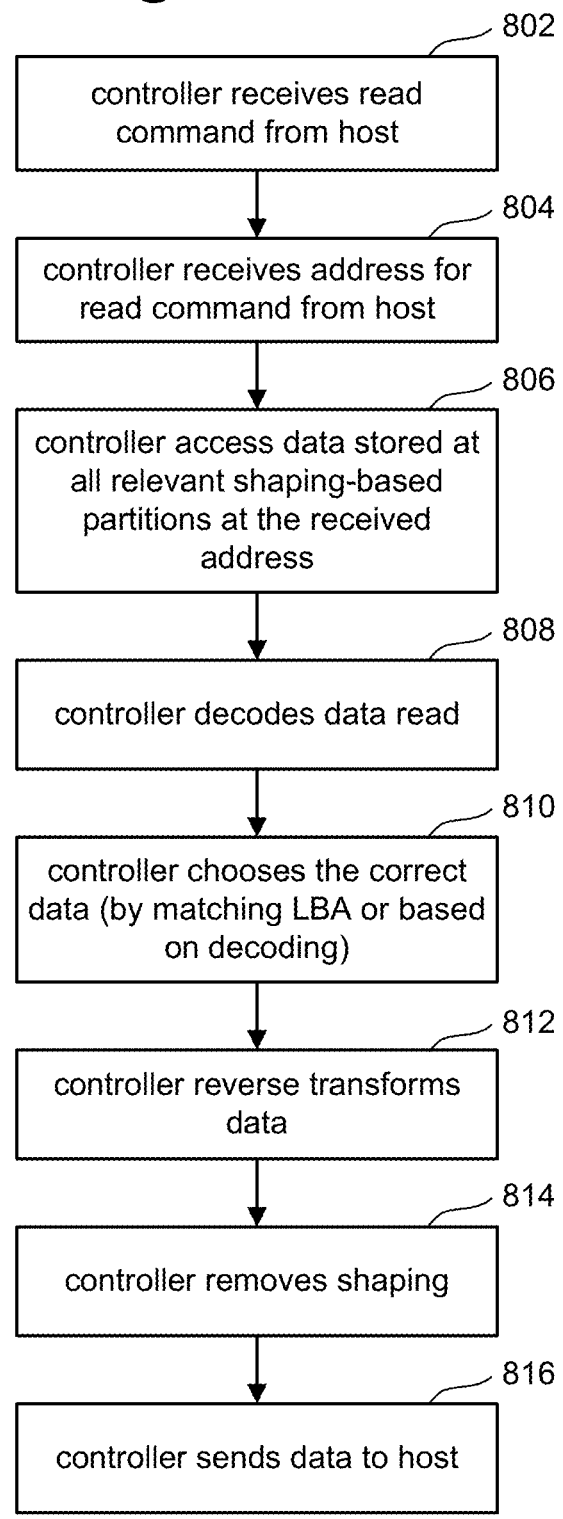
FIG. 15 is a flow chart describing one embodiment of a process for reading data.
Figure 16:
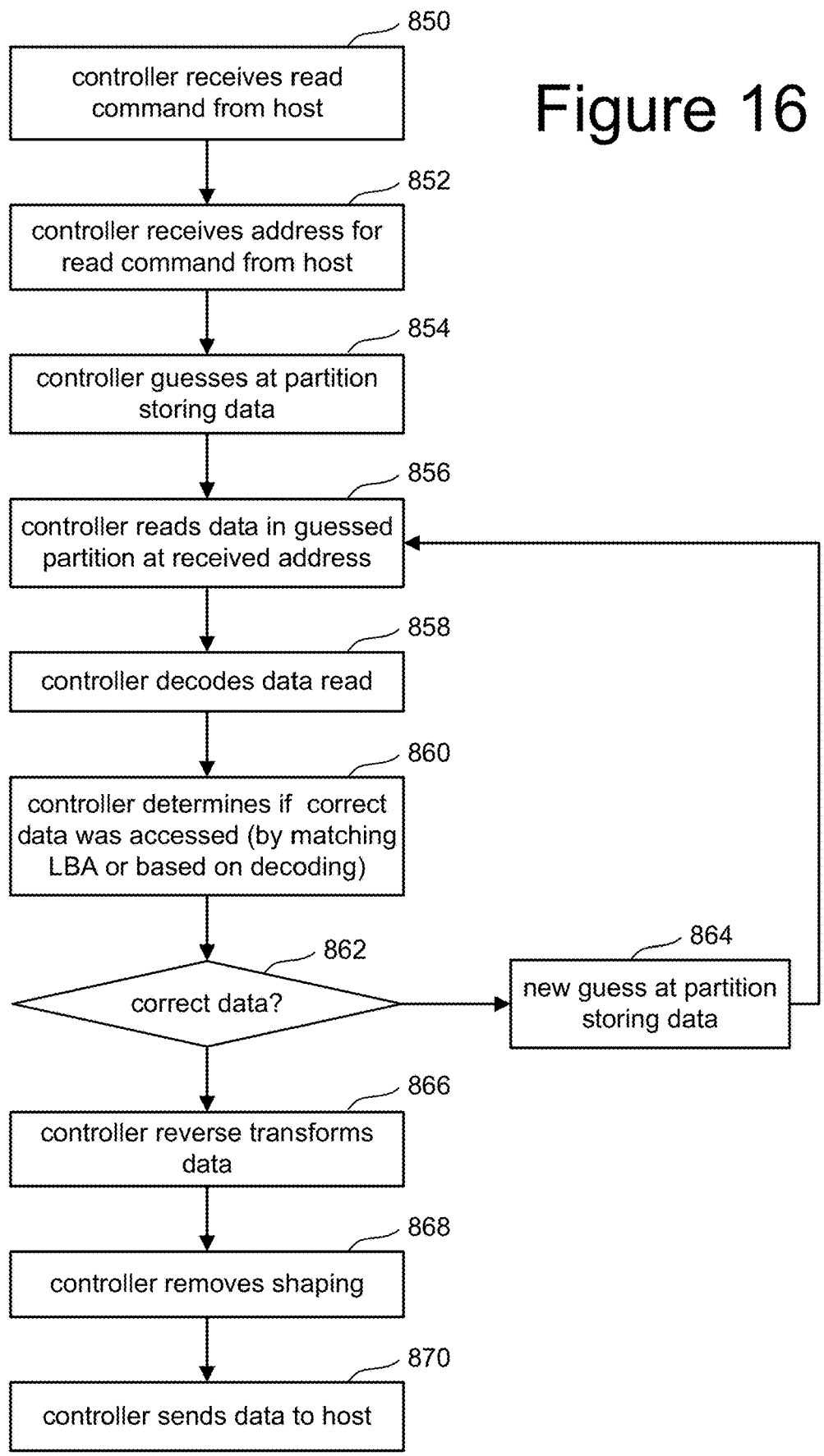
FIG. 16 is a flow chart describing one embodiment of a process for reading data.

In the embodiment of FIGS. 13 and 14, the host address space is reduced. For example, in some embodiments, each of the partitions will have common addresses. Thus, a host address will correspond to a location in multiple partitions, with the partition used being chosen by the controller. In this manner, the host does not know which partition was chosen. When the host needs to read the data, it sends an address for the read operation. That address can correspond to locations in multiple partitions. There are multiple methods for reading in this circumstance. FIGS. 15 and 16 describe two examples of reading that can be used with the embodiments of FIGS. 13 and 14.

FIG. 15 is a flow chart describing one embodiment for reading data from the non-volatile storage. The process of FIG. 15 is one example implementation of steps 550-552 of FIG. 9 for an embodiment in which the controller reads information sets from multiple partitions in response to the request to read and chooses one information set to report. In step 802, the controller receives a read command from the host. In step 804, the controller receives an address for the read command from the host. In step 806, the controller access data stored at all partitions at the received address. As mentioned above, in one embodiment, each partition will have the same set of addresses. In step 808, the controller decodes the data. In some embodiments, before the data is stored in the non-volatile memory, the data is encoded as part of an Error Correction Code process to add ECC information. Step 808 includes recovering the transformed and shaped data by a decoding process that removes the ECC information. In some embodiments, the ECC process can be performed before or after data shaping and before or after transforming the shaped data.

In step 810, the controller chooses the correct data from the multiple data sets read in step 806. In some implementations, only the correct data will decode properly in step 808. Data from the incorrect partitions will not decode thereby resulting in an error for those data samples. In another embodiment, the controller will store the Logical Block Address ("LBA") with the data (e.g., in a header); therefore, only one of the data samples read in step 806 will have the correct LBA and step 810 will include the controller choosing the data with the correct LBA. In some embodiments, the address received from the host is the LBA and the controller translates that address to a physical address in the physical memory. In step 812, the controller reverses the transform of the data. In step 814, the controller removes the data shaping in order to recover the original data. In step 816, the unshaped data is transmitted to the host.

FIG. 16 is a flow chart describing one embodiment for reading data from the non-volatile storage. The process of FIG. 16 is one example implementation of steps 550-552 of FIG. 9 for an embodiment in which the control circuit is configured to receive a request to read the shaped data, randomly choose a partition, and read an information set from the randomly chosen partition to report. In step 850 of FIG. 16, the controller receives a read command from the host. In step 852, the controller receives an address for the read command from the host. In step 854, the controller randomly guesses a partition. In some embodiments, the guess is completely random. In other embodiments, the guess is based on previous read commands. For example, the controller may guess the most frequently accessed partition lately or the partition with the most data in it. The controller may also guess the partition based on a table tracking LBA's converted to physical addresses. In step 856, the controller reads the data in the guessesd partition at the address received in step 852. In step 858, the controller decodes the data read (e.g., as part of the ECC process). In step 860, the controller determines if the data read was the correct data by determining if the ECC decoding was successful or the data included the correct LBA (see discussion above with respect to FIG. 15). If the data just read is not the correct data (step 862), then in step 864 the controller makes a new guess for a different partition and the process loops back to step 856. If the data just read is the correct data (step 862), then in step 866 the controller reverse transforms the data. In step 868, the controller removes the data shaping. In step 870, the controller sends the original unshaped data to the host that sent the read command.

The technology proposed above shapes data received from the host based on its entropy potential to one of a pre-defined number of shaping levels. The memory is divided into different partitions, where each partitions corresponds to data with a different shaping level. Such an arrangement results in a reduction in programming duration and a reduction in power used to program.

One embodiment includes a non-volatile storage apparatus, comprising: a non-volatile storage structure comprising non-volatile memory cells organized into multiple partitions, each physical partition preassigned to a different shaping level; and a control circuit connected to the non-volatile storage structure, the control circuit is configured to write shaped data to a partition of the multiple physical partitions that is preassigned to a same shaping level as the shaped data.

The non-volatile storage structure can be one die or multiple dies, and/or one array or multiple arrays. In one embodiment, the non-volatile storage apparatus is a SSD. In one embodiment, the non-volatile memory cells are PCM memory cells. In one embodiment, the control circuit is configured to perform direct writes, without erasing. In one embodiment, the control circuit is configured to perform asymmetrical writes such that writing from a first value to a second value takes longer than writing from the second value to the first value. In one embodiment, the control circuit is configured to transform the shaped data by rearranging bits into runs of similar values using a Burrows-Wheeler transform. In one embodiment, the control circuit is configured to receive a flash memory unit and an indication of a shaping level from a host, such that the host chooses the shaping level. In one embodiment, the control circuit is a controller configured to receive a flash memory unit from a host, such that the controller chooses the shaping level. In one embodiment, the control circuit is configured to determine entropy of a flash memory unit and choose a shaping level based on the entropy. In one embodiment, the control circuit is configured to receive a flash memory unit and an indication of a shaping level from a host, such that the host determines entropy of the flash memory unit and chooses the shaping level based on the entropy. In one embodiment, the control circuit is configured to read the shaped data from the non-volatile storage structure, remove the shaping and return unshaped data back to the host. In one embodiment, the control circuit is configured to read the shaped data from the non-volatile storage structure and return the shaped data back to the host. In one embodiment, the use of physical partitions preassigned to different shaping levels results in faster writing of data using less power, and with less wear on the non-volatile storage structure. In one embodiment, the control circuit is configured to receive a flash memory unit and an indication of a shaping level from a host, such that the host chooses the physical partition for writing to. In one embodiment, the control circuit is a controller configured to receive a flash memory unit from a host, such that the controller chooses the physical partition for writing to. In one embodiment, the control circuit is configured to receive a request to read the shaped data, read information sets from multiple partitions in response to the request to read and choose one information set read to report. In one embodiment, the control circuit is configured to receive a request to read the shaped data, randomly choose a partition, and read an information sets from the randomly chosen partition to report. In one embodiment, the control circuit is configured to receive a request to read the shaped data, choose a partition based on past reads, and read an information sets from the chosen partition to report.

One embodiment includes a method for writing data to phase change memory, comprising: accessing a unit of data; determining entropy of the unit of data; choosing a shaping level for the unit of data based on the determined entropy; shaping the unit of data to achieve the chosen shaping level; programming (writing) the shaped unit of data into a physical partition of the phase change memory preassigned to the chosen shaping level; reading the shaped data from the physical partition; and unshaping (removing the shaping to restore) the data. In one embodiment, the method further comprises transforming the shaped data by rearranging bits into runs of same values.

One embodiment includes a non-volatile storage apparatus, comprising: a host interface configured to communicate with a host; a memory interface configured for communication with non-volatile storage; and a processor connected to the host interface and the memory interface, the processor is configured to receive a unit of data and an indication of a shaping level from a host via the host interface, the processor is configured to shape the unit of data to achieve the shaping level, the processor is configured to choose a partition of the non-volatile storage based on the indication of the shaping level and program the unit of data into the chosen partition via the memory interface. The indication of a shaping level can be a data value that represents a shaping level, a command associated with a shaping level or data that has been shaped in a manner that allows the shaping level to be inferred.

Although the examples explain above pertain to PCM memory, the technology described herein can be used with other types of memory. In one set of embodiments, the technology described herein can be used with any memory that is bit addressable non-volatile memory (direct write) with asymmetric length of data state transition.

Note that in the above discussion, SET and RESET are names used to describe operations. Other names can also be used. Additionally, some embodiments may use SET and RESET in an opposite manner. Changing the name of the operation does not affect the technology described herein.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a non-volatile storage structure comprising non-volatile memory cells organized into multiple physical partitions, each physical partition of the multiple physical partitions is preassigned to a different shaping level; and
a control circuit connected to the non-volatile storage structure, the control circuit is configured to:
receive data,
determine entropy of the received data,
choose a shaping level for the received data based on the determined entropy,
shape the received data to achieve the chosen shaping level which results in shaped data,
choose a physical partition of the multiple physical partitions that is preassigned to the same shaping level as the shaped data, and
write the shaped data to the chosen physical partition of the multiple physical partitions that is preassigned to the same shaping level as the shaped data.

2. The non-volatile storage apparatus of claim 1, wherein:
the control circuit is configured to transform the shaped data by rearranging bits into runs of same values prior to writing the shaped data.

3. The non-volatile storage apparatus of claim 1, wherein:
the control circuit is configured to receive a request to read data at an address, each of the multiple physical partitions has a location corresponding to the address;
the control circuit is configured to read data at the address from the multiple physical partitions, resulting in multiple data chunks read from different physical partitions;
the control circuit is configured to choose the correct data chunk read from the multiple data chunks read; and
the control circuit is configured to send out the chosen correct data chunk in response to the request.

4. The apparatus of claim 1, wherein:
the non-volatile memory cells are phase change memory cells that exhibit asymmetrical performance when writing data; and
the control circuit is a controller connected to the phase change memory cells.

5. The apparatus of claim 1, wherein:
the control circuit is configured to write the shaped data to the physical partition of the multiple physical partitions that is preassigned to the same shaping level as the shaped data and that is already storing existing data that is already shaped at the same shaping level as the shaped data.

6. A non-volatile storage apparatus, comprising:
a non-volatile storage structure comprising non-volatile memory cells organized into multiple physical partitions, each physical partition of the multiple physical partitions is preassigned to a different shaping level; and
a control circuit connected to the non-volatile storage structure, the control circuit is configured to write shaped data to a physical partition of the multiple physical partitions that is preassigned to a same shaping level as the shaped data;
the control circuit is configured to receive a request to read data at an address, each of the multiple physical partitions has a location corresponding to the address;
the control circuit is configured to choose one of the multiple physical partitions, read a data chunk from the chosen physical partition, and determine whether the data chunk read is correct data until the control circuit finds the correct data; and
the control circuit is configured to report the correct data.

7. A method for writing data to non-volatile memory, comprising:
- accessing a unit of data;
- determining entropy of the unit of data;
- choosing a shaping level for the unit of data based on the determined entropy;
- shaping the unit of data to achieve the chosen shaping level;
- choosing a partition of the non-volatile memory that is preassigned to the chosen shaping level; and
- programming the shaped unit of data into the chosen partition of the non-volatile memory that is preassigned to the chosen shaping level.

8. The method of claim 7, further comprising:
- transforming the shaped unit of data by rearranging bits into runs of same values, the programming comprises programming the transformed shaped unit of data into the chosen partition of the non-volatile memory that is preassigned to the chosen shaping level.

9. The method of claim 7, wherein:
- the determining entropy, choosing the shaping level, shaping and choosing the partition are performed by a controller connected to a memory die, the memory die comprising the non-volatile memory.

10. The method of claim 7, wherein:
- the determining entropy, choosing the shaping level, shaping and choosing the partition are performed by a host that is in communication with a controller of a memory system, the controller is connected to a memory die, the memory die comprising the non-volatile memory, the controller and the memory die perform the programming.

11. The method of claim 7, wherein:
- the determining entropy, choosing the shaping level and choosing the partition are performed by a host that is in communication with a controller of a memory system, the controller is connected to a memory die, the memory die comprising the non-volatile memory;
- the shaping is performed by the controller; and
- the programming is performed by the controller and the memory die.

12. The method of claim 7, further comprising:
- a host sending a request to read the unit of data to a controller of a memory system, the controller is connected to a memory die, the memory die comprising the non-volatile memory;
- the controller reads the shaped unit of data programmed in the non-volatile memory;
- the controller sends shaped unit of data read to the host; and
- the host removes shaping from the shaped unit of data.

13. The method of claim 7, wherein:
- the determining entropy and choosing the shaping level are performed by a host that is in communication with a controller of a memory system, the controller is connected to a memory die, the memory die comprising the non-volatile memory;
- the method further includes the host sending to the controller an indication of the shaping level;
- the shaping and choosing the partition are performed by the controller; and
- the programming is performed by the controller and the memory die.

14. The method of claim 13, further comprising:
- the controller receiving a request to read data at an address;
- the controller reading multiple data chunks, each data chunk read from a different partition at a location corresponding to the address;
- the controller choosing one of the data chunks to be correct data; and
- the controller reporting the chosen data chunk.

15. The method of claim 13, further comprising:
- (a) the controller receiving a request to read data at an address, the non-volatile memory comprising multiple partitions that include the address;
- (b) the controller choosing one of the multiple partitions and reading a data chunk from the chosen partition;
- (c) the controller determining whether the data chunk read in (b) is correct data;
- (d) repeating (b) and (c) if the data chunk read in (b) is not correct data; and
- (e) reporting the data chunk if the data chunk read in (b) is correct data.

16. A non-volatile storage apparatus, comprising:
- a host interface configured to communicate with a host;
- a memory interface configured for communication with non-volatile storage; and
- a processor connected to the host interface and the memory interface, the processor is configured to receive a unit of data and an indication of a shaping level from a host via the host interface, the processor configured to shape the unit of data to achieve the shaping level, the processor is configured to choose a partition of the non-volatile storage based on the indication of the shaping level and program the shaped unit of data into the chosen partition via the memory interface.

* * * * *